(12) United States Patent
Kim

(10) Patent No.: US 8,441,129 B2
(45) Date of Patent: May 14, 2013

(54) SEMICONDUCTOR DEVICE

(75) Inventor: Ki Young Kim, Seongnam-si (KR)

(73) Assignee: SK Hynix Inc., Gyeonggi-do (KR)

( * ) Notice: Subject to any disclaimer, the term of this patent is extended or adjusted under 35 U.S.C. 154(b) by 0 days.

(21) Appl. No.: 13/412,245

(22) Filed: Mar. 5, 2012

(65) Prior Publication Data

US 2012/0286426 A1    Nov. 15, 2012

(30) Foreign Application Priority Data

May 11, 2011    (KR) .......................... 10-2011-0044099

(51) Int. Cl.
*H01L 23/48*    (2006.01)
*H01L 23/52*    (2006.01)
*H01L 29/40*    (2006.01)

(52) U.S. Cl.
USPC ............ 257/773; 257/686; 257/777; 257/778

(58) Field of Classification Search ................... 257/686, 257/777, 778, 773
See application file for complete search history.

(56) References Cited

U.S. PATENT DOCUMENTS

| | | | | |
|---|---|---|---|---|
| 2004/0135243 | A1* | 7/2004 | Aoyagi ........................ | 257/686 |
| 2007/0052083 | A1* | 3/2007 | Kobayashi et al. ........... | 257/686 |
| 2009/0014856 | A1* | 1/2009 | Knickerbocker ............. | 257/680 |
| 2009/0134528 | A1* | 5/2009 | Lee et al. ...................... | 257/777 |
| 2009/0243069 | A1* | 10/2009 | Camacho et al. ............. | 257/686 |
| 2010/0314736 | A1* | 12/2010 | Ko et al. ....................... | 257/686 |
| 2011/0101542 | A1* | 5/2011 | Camacho et al. ............. | 257/778 |

* cited by examiner

*Primary Examiner* — S. V. Clark
(74) *Attorney, Agent, or Firm* — William Park & Associates Patent Ltd.

(57) ABSTRACT

A semiconductor device includes a first structural body having first electrode pads; a second structural body disposed in a face-up type over the first structural body in such a way as to expose the first electrode pads, and having first connection members with at least two protrusions; and a third structural body disposed in a face-down type over the second structural body, and having second connection members with at least two protrusions, on a surface thereof facing the second structural body, wherein some of the protrusions of the second connection members are electrically connected with the exposed first electrode pads, and at least one of remaining protrusions of the second connection members is electrically connected with the first connection members.

15 Claims, 2 Drawing Sheets

SEMICONDUCTOR DEVICE

CROSS-REFERENCE TO RELATED APPLICATIONS

The present application claims priority to Korean patent application number 10-2011-0044099 filed on May 11, 2011, which is incorporated herein by reference in its entirety.

BACKGROUND OF THE INVENTION

The present invention relates generally to a semiconductor device, and more particularly to a semiconductor device which is realized by flip-chip bonding a plurality of semiconductor chips while improving the characteristics and the manufacturing yield of a semiconductor package.

In general, a semiconductor packaging technology refers to a technology of manufacturing a semiconductor package product by mounting a semiconductor chip to a substrate or electrically connecting packages each including a substrate and a semiconductor chip. A semiconductor package includes a substrate and a semiconductor chip placed on the substrate. In order to electrically connect the semiconductor chip with the substrate, a wire bonding method or a flip-chip bonding method is used.

In the case where a semiconductor package is manufactured using the wire bonding method, a semiconductor chip is attached to a substrate by the medium of an adhesive, and the bonding pads of the semiconductor chip and the bond fingers of the substrate are coupled with each other using metal wires through a wire bonding process so that the substrate and the semiconductor chip are electrically connected with each other.

However, in the case of manufacturing the semiconductor package using the wire bonding method, since exchange of electrical signals between the semiconductor chip and the substrate is implemented through the metal wires, the operating speed of the semiconductor package becomes slow, and the electrical characteristics of the semiconductor chip may deteriorate due to the use of a number of metal wires.

In the case where a semiconductor package is manufactured through the flip-chip bonding method, a semiconductor chip is flip-chip bonded to a substrate by the medium of connection members such that the semiconductor chip and the substrate face each other, by which the substrate and the semiconductor chip are electrically connected with each other by the connection members. Then, an underfill process is performed to fill the space between the semiconductor chip and the substrate.

In the case of manufacturing the semiconductor package using the flip-chip bonding method, since exchange of electrical signals between the semiconductor chip and the substrate placed to face each other is implemented through the connection members, signal transfer paths are shortened when compared to the case of using the wire bonding method, and advantages are provided in terms of the operating speed of the semiconductor package.

However, in the case of manufacturing the semiconductor package using the flip-chip bonding method, since electrical connections are formed with the substrate and the semiconductor chip placed to face each other, if a plurality of semiconductor chips are stacked on the substrate, it is difficult to appropriately connect the semiconductor chips with one another and the semiconductor chips with the substrate.

BRIEF SUMMARY OF THE INVENTION

An embodiment of the present invention is directed to a semiconductor device which is realized by flip-chip bonding a plurality of semiconductor chips.

Also, an embodiment of the present invention is directed to a semiconductor device which can improve the characteristics and the manufacturing yield of a semiconductor package.

In one embodiment of the present invention, a semiconductor device includes: a first structural body having first electrode pads; a second structural body disposed in a face-up type over the first structural body in such a way as to expose the first electrode pads, and having first connection members with a prominent and depressed shape which has at least two protrusions; and a third structural body disposed in a face-down type over the second structural body, and having second connection members with a prominent and depressed shape which has at least two protrusions, on a surface thereof facing the second structural body, wherein some of the protrusions of the second connection members are electrically connected with the exposed first electrode pads, and at least one of remaining protrusions of the second connection members is electrically connected with the first connection members.

The first structural body may include any one of a semiconductor device and a printed circuit board.

The semiconductor device may include any one selected among an image sensor, a memory semiconductor, a system semiconductor, a passive device, an active device and a sensor semiconductor.

The printed circuit board may include any one selected among a module substrate, a package substrate, a flexible substrate and a main board.

Each of the second and third structural bodies may include any one of a semiconductor chip and a semiconductor package.

The first and second connection members may include bumps.

The semiconductor device may further include an adhesive interposed between the first structural body and the second structural body.

The semiconductor device may further include a fourth structural body disposed in a face-down type between the second structural body and the third structural body, and having third connection members which are electrically connected with the first connection members.

The fourth structural body may include any one of a semiconductor chip and a semiconductor package.

The third connection members may include any ones of bumps, solder balls and conductive posts.

The semiconductor device may further include an adhesive interposed between the third structural body and the fourth structural body.

The fourth structural bodies may be provided one or more.

A plurality of fourth structural bodies may be stacked in a stepwise manner.

Third connection members of each of the plurality of fourth structural bodies may have different heights.

The semiconductor device may further include adhesives respectively interposed between the plurality of fourth structural bodies.

DESCRIPTION OF SPECIFIC EMBODIMENTS

Hereafter, specific embodiments of the present invention will be described in detail with reference to the accompanying drawings.

It is to be understood herein that the drawings are not necessarily to scale and in some instances proportions may have been exaggerated in order to more clearly depict certain features of the invention.

Figure 1:
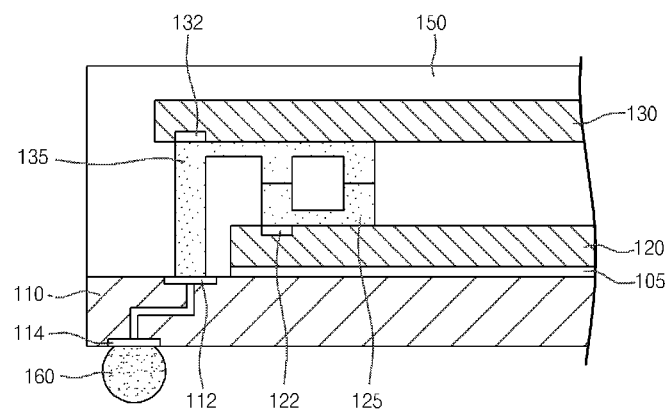
FIG. 1 is a cross-sectional view illustrating a semiconductor package in accordance with an embodiment of the present invention.

FIG. 1 is a cross-sectional view illustrating a semiconductor package in accordance with an embodiment of the present invention.

Referring to FIG. 1, a second structural body 120 and a third structural body 130 are disposed over a first structural body 110.

For example, the first structural body 110 includes a semiconductor device such as an image sensor, a memory semiconductor, a system semiconductor, a passive device, an active device and a sensor semiconductor or any one selected among a module substrate, a package substrate, a flexible substrate and a main board. Each of the second structural body 120 and the third structural body 130 includes, for example, any one selected from a semiconductor chip and a semiconductor package.

Hereinbelow, it will be exemplified that the first structural body 110 is a printed circuit board and the second and third structural bodies 120 and 130 are semiconductor chips.

The first structural body 110 has an upper surface and a lower surface which faces away from the upper surface. First electrode pads 112 are formed on the upper surface of the first structural body 110, and second electrode pads 114, which are electrically connected with the first electrode pads 112, are formed on the lower surface of the first structural body 110. The first electrode pads 112 include, for example, bond fingers, and the second electrode pads 114 include, for example, ball lands.

The second structural body 120 is attached to the upper surface of the first structural body 110 by the medium of an adhesive 105. The second structural body 120 is disposed such that the first electrode pads 112 of the first structural body 110 are exposed. First bonding pads 122 are formed on one surface of the second structural body 120, and the second structural body 120 is disposed in a face-up type such that the one surface, on which the first bonding pads 122 are formed, faces upward.

First connection members 125, each of which has protrusions and grooves, are formed on the first bonding pads 122 of the second structural body 120. Each first connection member 125 has at least two protrusions. The first connection members 125 include, for example, bumps.

The third structural body 130 is disposed over the second structural body 120. Second bonding pads 132 are formed one surface of the third structural body 130, and the third structural body 130 is disposed in a face-down type such that the one surface, on which the second bonding pads 132 are formed, faces downward. That is, the second structural body 120 and the third structural body 130 are arranged such that their surfaces, on which the first bonding pads 122 and the second bonding pads 132 are formed, face each other.

Second connection members 135, each of which has protrusions and grooves, are formed on the second bonding pads 132 of the third structural body 130. Each second connection member 135 has at least two, for example, three protrusions. The second connection members 135 include, for example, bumps.

In the second connection members 135 of the third structural body 130, some of the protrusions are electrically connected with the exposed first electrode pads 112 of the first structural body 110, and at least one of the remaining protrusions is electrically connected with the first connection members 125 of the second structural body 120.

In other words, as the second connection members 135 of the third structural body 130 include at least two protrusions, some of the protrusions of the second connection members 135 may be electrically connected with the first structural body 110, and the remaining protrusions may be electrically connected with the second structural body 120 facing the third structural body 130. As a consequence, in an embodiment of the present invention, electrical connections among the first to third structural bodies 110, 120 and 130 may be easily formed.

Also, in the second connection members 135 of the third structural body 130, in order to compensate for a height difference at places where the second connection members 135 are connected with the first structural body 110 and the second structural body 120, the protrusions may have a relatively larger height at places where the second connection members 135 are connected with the first structural body 110.

While not shown in a drawing, it is conceivable that, in the second connection members 135 of the third structural body 130, the protrusions have the same height at places where the second connection members 135 are connected with the first structural body 110 and the second structural body 120. In this case, in order to compensate for a height difference, connection members may be additionally arranged on the protrusions of the second connection members 135 connected with the first structural body 110.

An encapsulation component 150 is formed on the upper surface of the first structural body 110 on which the second and third structural bodies 120 and 130 are arranged, in such a way as to seal the upper surface of the first structural body 110, and external connection terminals 160 are formed on the second electrode pads 114 which are formed on the lower surface of the first structural body 110.

As described above, in an embodiment of the present invention, the second structural body 120, including the first connection members 125, each of which has a plurality of protrusions, is disposed on the first structural body 110, and the third structural body 130, including the second connection members 135, each of which has a plurality of protrusions, is disposed on the second structural body 120 such that the third structural body 130 faces the second structural body 120. As a consequence, electrical connection among the first to third structural bodies 110, 120 and 130 may be easily implemented.

In an embodiment of the present invention, as the second connection members 135 of the third structural body 130 have a plurality of protrusions, some of the plurality of protrusions may be electrically connected with the first structural body 110, and at least one of the remaining protrusions may be electrically connected with the second structural body 120. Thus, due to the presence of the second connection members 135, not only the electrical connection between the first structural body 110 and the third structural body 130 but also the electrical connection between the second structural body 120 and the third structural body 130 may be easily implemented.

Therefore, in an embodiment of the present invention, even in the case where a semiconductor package is manufactured using a flip-chip bonding method that is advantageous in terms of the operating speed of the semiconductor package since signal transfer paths are relatively short, it is possible to stack a plurality of semiconductor chips, for example, the second and third structural bodies 120 and 130, on the first structural body 110, whereby the characteristics of the semiconductor package may be improved and the mounting density and capacity of the semiconductor package may increase.

While it was illustrated and described in the above embodiment of the present invention that the second structural body 120 and the third structural body 130 are disposed on the first structural body 110, it can be envisaged in another embodiment of the present invention that a fourth structural body is additionally disposed between the second structural body 120 and the third structural body 130.

Figure 2:
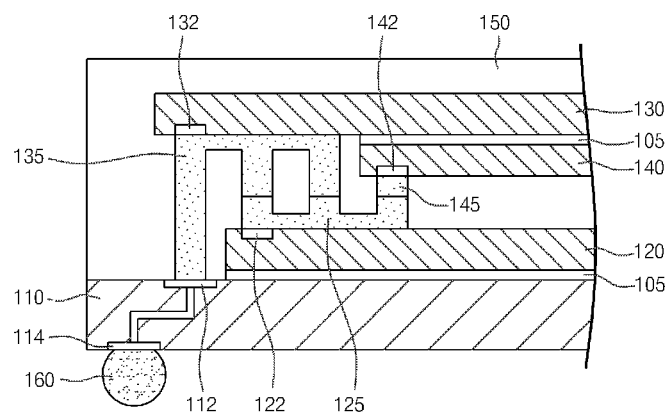
FIG. 2 is a cross-sectional view illustrating a semiconductor package in accordance with an embodiment of the present invention.

FIG. 2 is a cross-sectional view illustrating a semiconductor package in accordance with an embodiment of the present invention.

Referring to FIG. 2, a first structural body 110 has an upper surface on which first electrode pads 112 are formed and a lower surface on which second electrode pads 114 electrically connected with the first electrode pads 112 are formed. A second structural body 120 is attached to the upper surface of the first structural body 110 by the medium of an adhesive 105. The second structural body 120 is disposed in a face-up type such that one surface of the second structural body 120, on which first bonding pads 122 are formed, faces upward and the first electrodes pads 112 of the first structural body 110 are exposed.

First connection members 125, each of which has protrusions and grooves, are formed on the first bonding pads 122 of the second structural body 120. Each first connection member 125 has at least two, for example, three protrusions. The first connection members 125 include, for example, bumps.

A fourth structural body 140 is disposed over the second structural body 120. The fourth structural body 140 includes any one of a semiconductor chip and a semiconductor package. For example, the fourth structural body 140 includes a semiconductor chip. The fourth structural body 140 is disposed such that some portions of the first connection members 125 of the second structural body 120, for example, the protrusions formed on the peripheral portions of the first connection members 125 are exposed.

The fourth structural body 140 is disposed in a face-down type such that one surface of the fourth structural body 104, on which third bonding pads 142 are formed, faces the second structural body 120, and third connection members 145 are formed on the third bonding pads 142. The third connection members 145 include bumps, solder balls or conductive posts.

The third connection members 145 of the fourth structural body 140 are electrically connected with some portions of the first connection members 125 of the second structural body 120 disposed thereunder, that is, some protrusions of the plurality of protrusions of the first connection members 125. In other words, the second structural body 120 and the second structural body 140, which are arranged to face each other, are electrically connected with each other by the first and third connection members 125 and 145.

Although not shown in a drawing, the second structural body 120 and the fourth structural body 140 may be electrically connected with each other by connecting the third bonding pads 142 of the fourth structural body 140 and the first connection members 125 of the second structural body 120 without using the third connection members 145.

A third structural body 130 is attached to the fourth structural body 140 by the medium of an adhesive 105. Second bonding pads 132 are formed one surface of the third structural body 130, and the third structural body 130 is disposed in a face-down type such that the one surface, on which the second bonding pads 132 are formed, faces downward. Second connection members 135, each of which has protrusions and grooves, are formed on the second bonding pads 132 of the third structural body 130. Each second connection member 135 has at least two, for example, three protrusions. The second connection members 135 include, for example, bumps.

In the second connection members 135 of the third structural body 130, some of the protrusions are electrically connected with the exposed first electrode pads 112 of the first structural body 110, and at least one of the remaining protrusions is electrically connected with the first connection members 125 of the second structural body 120.

While not shown in a drawing, in the second connection members 135 of the third structural body 130, the protrusions may have the same height at places where the second connection members 135 are connected with the first structural body 110 and the second structural body 120. In this case, in order to compensate for a height difference, connection members may be additionally arranged on the protrusions of the second connection members 135 which are connected with the first structural body 110.

An encapsulation component 150 is formed on the upper surface of the first structural body 110 on which the second to fourth structural bodies 120, 130 and 140 are arranged, in such a way as to seal the upper surface of the first structural body 110, and external connection terminals 160 are formed on the second electrode pads 114 which are formed on the lower surface of the first structural body 110.

As is apparent from the above descriptions, in an embodiment of the present invention, since the third structural body 130 has the second connection members 135 with a plurality of protrusions, some of the protrusions of the second connection members 135 may be electrically connected with the first structural body 110, and some of the remaining protrusions may be electrically connected with the second structural body 120.

In addition, in an embodiment of the present invention, due to the fact that the second structural body 120 has the first connection members 125 with a plurality of protrusions, some of the protrusions of the first connection members 125 may be electrically connected with the fourth structural body 140, and some of the remaining protrusions may be electrically connected with the third structural body 130.

In an embodiment of the present invention, even when the fourth structural body 140 is additionally disposed between the second structural body 120 and the third structural body 130, electrical connection among the first structural body 110, the second structural body 120, the third structural body 130 and the fourth structural body 140 may be easily implemented, whereby electrical connection among an increased number of structural bodies is made possible.

While it was illustrated and described in the above embodiment of the present invention that one of fourth structural body 140 is disposed between the second structural body 120 and the third structural body 130, at least two of fourth structural bodies 140 are arranged between the second structural body 120 and the third structural body 130.

Figure 3:
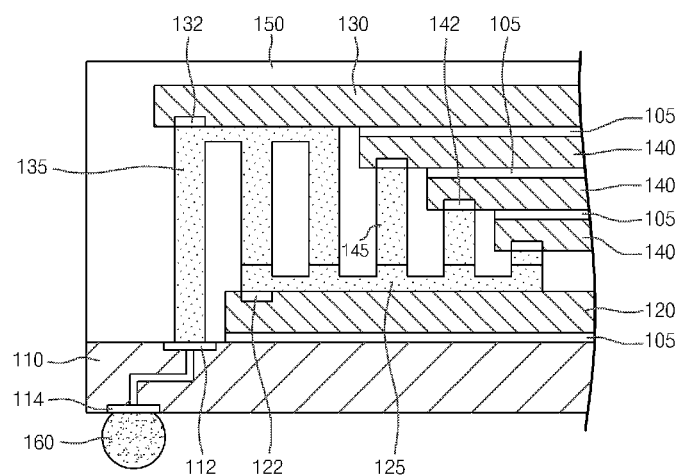
FIG. 3 is a cross-sectional view illustrating a semiconductor package in accordance with an embodiment of the present invention.

FIG. 3 is a cross-sectional view illustrating a semiconductor package in accordance with an embodiment of the present invention.

Referring to FIG. 3, second and third structural bodies 120 and 130 are arranged on a first structural body 110. The first to third structural bodies 110, 120 and 130 are arranged to have the same structure as the embodiments of the present invention described above.

At least two, for example, three of fourth structural bodies 140 are disposed between the second structural body 120 and the third structural body 130. First connection members 125 of the second structural body 120 are formed to have at least two, for example, five protrusions. The number of protrusions of the first connection members 125 may be adjusted depending upon the number of the fourth structural bodies 140 stacked thereon.

The plurality of fourth structural bodies 140 are stacked over the second structural body 120 in a stepwise manner and are arranged such that some portions of the first connection members 125 of the second structural body 120 are exposed. Adhesives 105 are respectively interposed between the fourth structural bodies 140. Third bonding pads 142 are formed on respective one surfaces of the plurality of fourth structural bodies 140, and the fourth structural bodies 140 are disposed in a face-down type such that the surface on which the third bonding pads 142 are formed face downward.

Third connection members 145 are formed on the respective third bonding pads 142 of the fourth structural bodies 140. The third connection members 145 include bumps, solder balls or conductive posts. The respective third connection members 145 are electrically connected with the first connection members 125 of the second structural body 120 which is disposed thereunder. That is, the respective fourth structural bodies 140, which are disposed to face the second structural body 120 and are stacked in the stepwise manner, are electrically connected with the second structural body 120 by the first and third connection members 125 and 145.

In the fourth structural bodies 140 stacked in the stepwise manner, in order to compensate for height differences among the fourth structural bodies 140, the third connection members 145 may have different heights. Although not shown in a drawing, the third connection members 145 may have the same height, and in this case, in order to compensate for height differences among the fourth structural bodies 140, connection members may be additionally arranged between the first connection members 125 and the third connection members 145.

As is apparent from the above descriptions, in an embodiment of the present invention, due to the fact that the plurality of fourth structural bodies 140 are stacked in the stepwise manner between the second structural body 120 and the third structural body 130, it is possible to stack an increased number of structural bodies over the first structural body 110, whereby the mounting density and capacity of the semiconductor package may effectively increase.

Although specific embodiments of the present invention have been described for illustrative purposes, those skilled in the art will appreciate that various modifications, additions and substitutions are possible, without departing from the scope and the spirit of the invention as disclosed in the accompanying claims.

What is claimed is:

1. A semiconductor device comprising:
a first structural body having first electrode pads;
a second structural body disposed in a face-up type over the first structural body in such a way as to expose the first electrode pads, and comprising first connection members with at least two protrusions; and
a third structural body disposed in a face-down type over the second structural body, and comprising second connection members with at least two protrusions on a surface thereof facing the second structural body,
wherein some of the protrusions of the second connection members are electrically connected with the exposed first electrode pads, and at least one of remaining protrusions of the second connection members is electrically connected with the first connection members.

2. The semiconductor device according to claim 1, wherein the first structural body comprises any one of a semiconductor device and a printed circuit board.

3. The semiconductor device according to claim 2, wherein the semiconductor device comprises any one selected among an image sensor, a memory semiconductor, a system semiconductor, a passive device, an active device and a sensor semiconductor.

4. The semiconductor device according to claim 2, wherein the printed circuit board comprises any one selected among a module substrate, a package substrate, a flexible substrate and a main board.

5. The semiconductor device according to claim 1, wherein each of the second and third structural bodies comprises any one of a semiconductor chip and a semiconductor package.

6. The semiconductor device according to claim 1, wherein the first and second connection members comprise bumps.

7. The semiconductor device according to claim 1, further comprising:
an adhesive interposed between the first structural body and the second structural body.

8. The semiconductor device according to claim 1, further comprising:
a fourth structural body disposed in a face-down type between the second structural body and the third structural body, and having third connection members which are electrically connected with the first connection members.

9. The semiconductor device according to claim 8, wherein the fourth structural body comprises any one of a semiconductor chip and a semiconductor package.

10. The semiconductor device according to claim 8, wherein the third connection members comprise bumps, solder balls or conductive posts.

11. The semiconductor device according to claim 8, further comprising:
an adhesive interposed between the third structural body and the fourth structural body.

12. The semiconductor device according to claim 8, wherein the fourth structural body are provided one or more.

13. The semiconductor device according to claim 12, wherein a plurality of fourth structural bodies are stacked in a stepwise manner.

14. The semiconductor device according to claim 12, wherein third connection members of each of the plurality of fourth structural bodies have different heights.

15. The semiconductor device according to claim 12, further comprising:
adhesives respectively interposed between the plurality of fourth structural bodies.

* * * * *